(12) United States Patent
Ye

(10) Patent No.: US 11,197,079 B2
(45) Date of Patent: Dec. 7, 2021

(54) MEMS MICROPHONE WITH HYBRID PACKAGING STRUCTURE

(71) Applicants: ZILLTEK TECHNOLOGY (SHANGHAI) CORP., Shanghai (CN); ZILLTEK TECHNOLOGY CORP., Hsinchu (TW)

(72) Inventor: Jinghua Ye, Shanghai (CN)

( * ) Notice: Subject to any disclaimer, the term of this patent is extended or adjusted under 35 U.S.C. 154(b) by 0 days.

(21) Appl. No.: 16/942,325

(22) Filed: Jul. 29, 2020

(65) Prior Publication Data

US 2021/0321184 A1  Oct. 14, 2021

(30) Foreign Application Priority Data

Apr. 13, 2020 (CN) .................. 202010286670.X

(51) Int. Cl.
| | |
|---|---|
| *H04R 1/00* | (2006.01) |
| *H04R 1/04* | (2006.01) |
| *B81B 7/00* | (2006.01) |
| *H04R 1/06* | (2006.01) |
| *H04R 3/00* | (2006.01) |
| *H04R 19/04* | (2006.01) |

(52) U.S. Cl.
CPC ............ *H04R 1/04* (2013.01); *B81B 7/0074* (2013.01); *H04R 1/06* (2013.01); *H04R 3/00* (2013.01); *H04R 19/04* (2013.01); *B81B 2201/0257* (2013.01); *B81B 2207/012* (2013.01); *B81B 2207/07* (2013.01); *H04R 2201/003* (2013.01)

(58) Field of Classification Search
CPC ... H04R 1/04; H04R 1/06; H04R 3/00; H04R 19/04; H04R 2201/003; B81B 7/0074; B81B 2207/012; B81B 2201/0257; B81B 2207/07

See application file for complete search history.

(56) References Cited

U.S. PATENT DOCUMENTS

2012/0250897 A1* 10/2012 Michel .................. H04R 19/04
381/111
2017/0164107 A1* 6/2017 Murgia .................. H04R 3/005

\* cited by examiner

*Primary Examiner* — Matthew A Eason
(74) *Attorney, Agent, or Firm* — Clement Cheng

(57) ABSTRACT

A MEMS microphone with a hybrid packaging structure is provided. The microphone comprises: a first circuit board; a second circuit board, spaced apart from the first circuit board and parallel to the first circuit board; a packaging cover, covering the second circuit board, and forming an acoustic cavity with the second circuit board; wherein the first circuit board and the second circuit board form an accommodating space in which a pressure sensor is disposed. In the present invention, the chip and electronics of the MEMS microphone are installed on two different circuit boards, respectively, so that an interior space of the microphone is fully utilized, a good heat dissipation is achieved, a better sound transmission effect is achieved, and the microphone can be widely used.

6 Claims, 6 Drawing Sheets

MEMS MICROPHONE WITH HYBRID PACKAGING STRUCTURE

BACKGROUND OF THE INVENTION

1. Field of the Invention

The invention relates to the field of Micro-Electro-Mechanical systems, and more particularly, to a MEMS microphone with a hybrid packaging structure.

2. Description of the Related Art

A MEMS (Micro Electro Mechanical System) microphone is a microphone that is produced using MEMS techniques.

The existing MEMS microphone has a disadvantage that all the chips and capacitors are installed on a printed circuit board. However, a higher requirement is imposed on the single printed circuit board. In addition, large space is available inside the packaging cover of the microphone, and most of space is not fully utilized in the packaging cover of the microphone.

SUMMARY OF THE INVENTION

An object of the present invention is to provide a MEMS microphone with a hybrid packaging structure to solve the above-mentioned technical problems.

For the problems to be solved in the present invention, the following technical solution is adopted.

A MEMS (Micro-Electro-Mechanical system) microphone with a hybrid packaging structure, comprising:
a first circuit board;
a second circuit board, spaced apart from the first circuit board and parallel to the first circuit board;
a packaging cover, covering the second circuit board, and forming an acoustic cavity with the second circuit board; wherein
the first circuit board and the second circuit board form an accommodating space in which a pressure sensor is disposed.

Preferably, the MEMS microphone further comprises at least one acoustic sensor and an integrated circuit processing chip each disposed on the first circuit board or the second circuit board.

Preferably, both the integrated circuit processing chip and the acoustic sensor are disposed on the second circuit board, the integrated circuit processing chip is electrically connected to the second circuit board via lead wires, and the integrated circuit processing chip is electrically connected to the acoustic sensor via gold wires.

Preferably, a sound access hole is disposed on the first circuit board, an acoustic through-hole is disposed on the second circuit board, and the acoustic sensor corresponds to the acoustic through-hole.

Preferably, the MEMS microphone further comprises: a supporting plate layer arranged along edges of the first circuit board and the second circuit board.

Preferably, the supporting plate layer is an integrally formed plate, the accommodating space is provided inside the integrally formed plate, and an area of the accommodating space is larger than that of the pressure sensor.

Preferably, the supporting plate layer comprises a first supporting plate, a second supporting plate, a third supporting plate, and a fourth supporting plate, all of which are sequentially connected to each other.

Preferably, a bottom of the first circuit board is provided with a plurality of pads.

By adopting the above-mentioned technical solutions, the present invention has the beneficial effects that the chip and electronics of the MEMS microphone are installed on two different circuit boards, respectively, so that an interior space of the microphone is fully utilized; an accommodating space is formed between the two circuit boards, facilitating the heat dissipation of the chip and the electronics (e.g., sensors), thus, a better sound transmission effect is achieved, and the microphone can be widely used.

BRIEF DESCRIPTION OF THE DRAWINGS

The accompanying drawings, together with the specification, illustrate exemplary embodiments of the present disclosure, and, together with the description, serve to explain the principles of the present invention.

In the accompanying drawings: 1—first circuit board; 2—pressure sensor; 3—second circuit board; 4—acoustic sensor; 5—integrated circuit processing chip; 6—supporting plate layer; 7—packaging cover; 9—lead wire; 10—sound access hole; 11—pad; 30—acoustic through—hole; 40—gold wire; 60—accommodating space; 70—acoustic cavity.

DETAILED DESCRIPTION

The technical solution set forth in the embodiments of the present invention will now be described clearly and fully hereinafter with reference to the accompanying drawings of the embodiments of the present invention. Obviously, such embodiments provided in the present invention are only part of the embodiments instead of all embodiments. It should be understood that all the other embodiments obtained from the embodiments set forth in the present invention by one skilled in the art without any creative work fall within the scope of the present invention.

Notably, the embodiments set forth in the present invention and features of the embodiments may be combined in any suitable manner.

The present invention will be described hereinafter with reference to the accompanying drawings and particular embodiments, but the invention is not limited thereto.

Example 1

Figure 1:
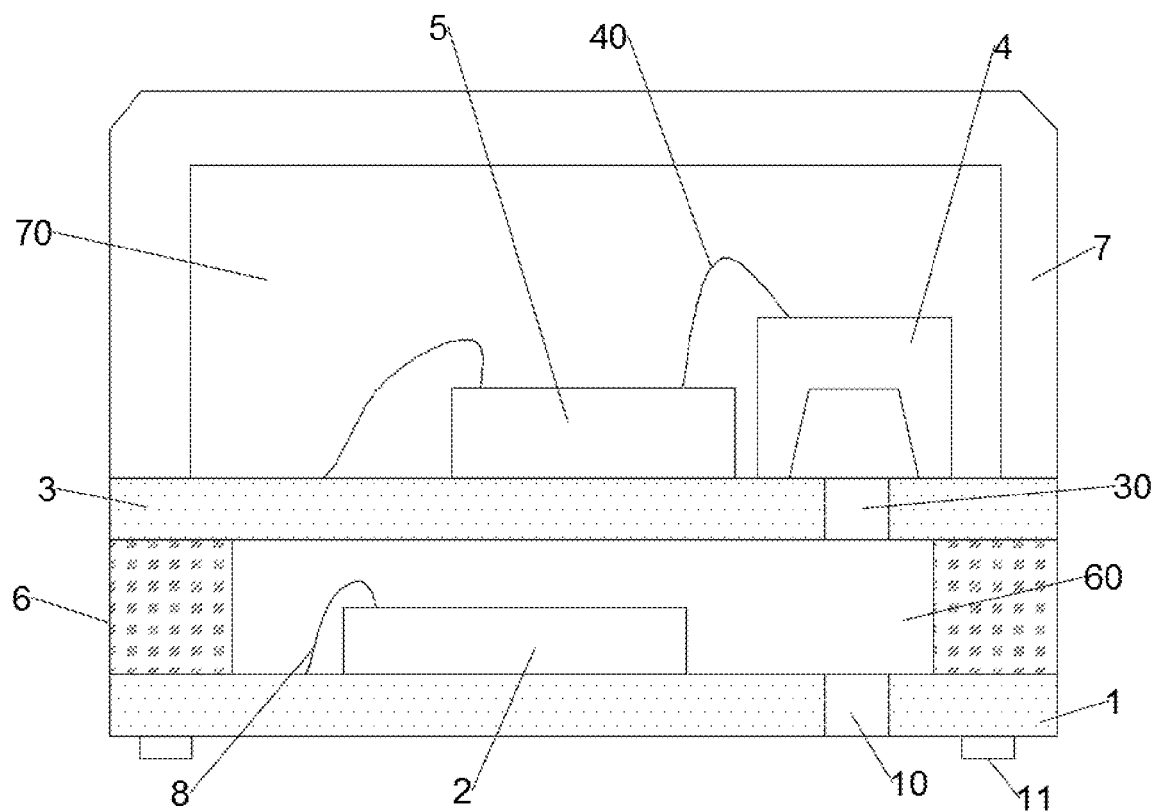
FIG. 1 is a schematic view of a microphone with a packaging structure according to a first embodiment of the present invention.
Figure 2:
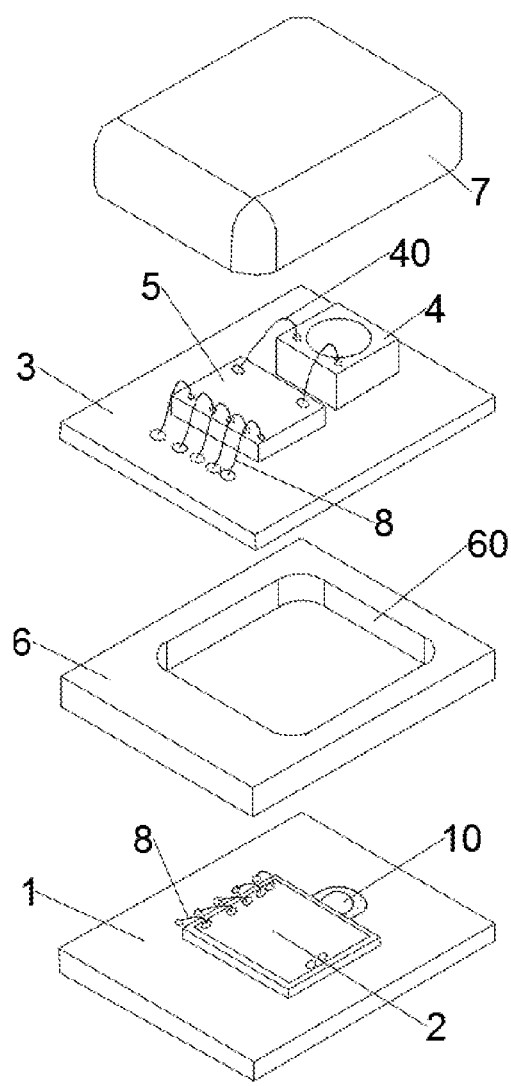
FIG. 2 is an explosive view of a microphone according to a first embodiment of the present invention.

As shown in FIGS. 1 and 2, the present invention provides a MEMS microphone with a hybrid packaging structure, comprising:
a first circuit board 1;

a pressure sensor 2, disposed on the first circuit board 1, and electrically connected to the first circuit board 1 via lead wires 8;

a second circuit board 3 electrically connected to the first circuit board 1, the second circuit board 3 being provided with;

an acoustic sensor 4;

an integrated circuit processing chip 5, electrically connected to the second circuit board 3 and the acoustic sensor 4 via the lead wires 8;

a supporting plate layer 6, sandwiched between the second circuit board 3 and the first circuit board 1; and a packaging cover 7, covering a top of the second circuit board 3.

Figure 3:
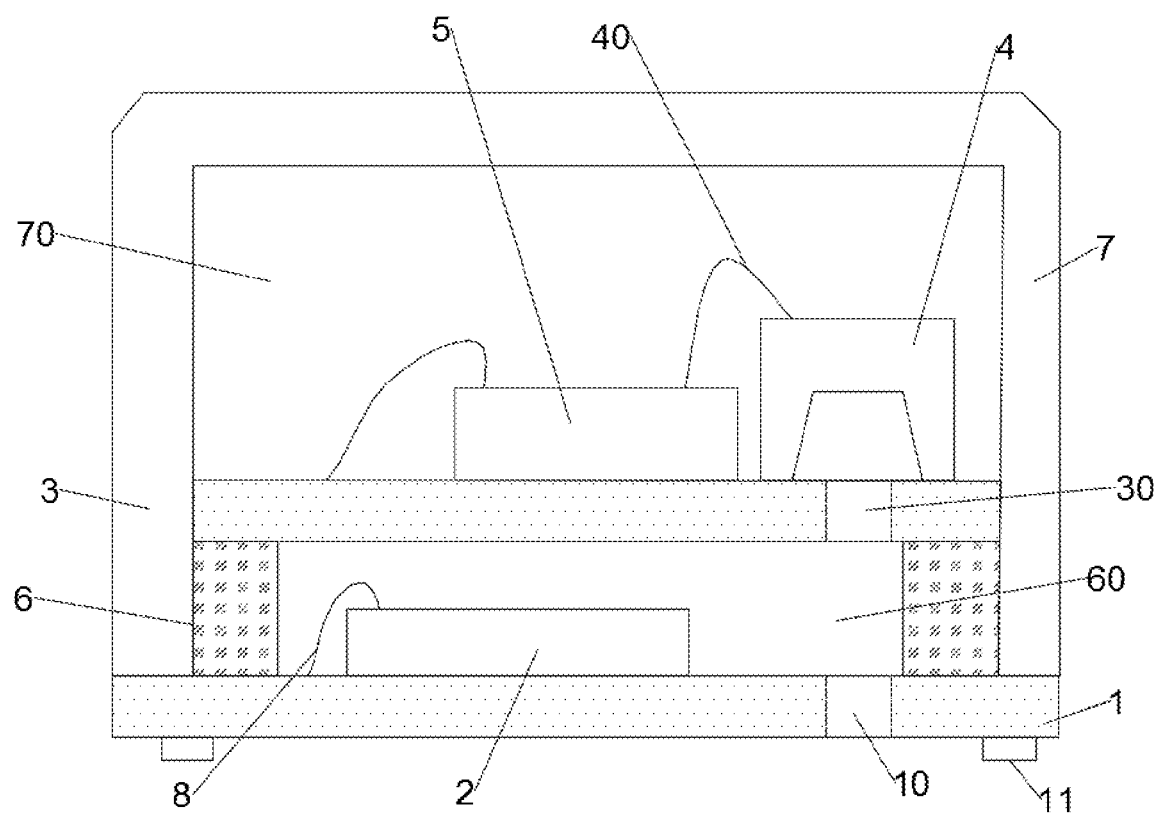
FIG. 3 is a schematic view of another packaging structure of a packaging cover of a microphone according to a first embodiment of the present invention.

Furthermore, another packaging structure is contemplated in the present invention, as shown in FIG. 3. The packaging cover 7 may also cover a top edge of the first circuit board 1. In this case, a bottom area of the packaging cover 7 is less than an area of the first circuit board 1 and greater than an area of the second circuit board 3. The second circuit board 3 is completely packaged inside the packaging cover 7, so that the second circuit board 3 is sealed off and well protected by the packaging cover 7, thereby exhibiting good seal ability.

The packaging cover 7 and the second circuit board 3 form an acoustic cavity 70.

A sound access hole 10 is disposed on the first circuit board 1.

The working principle of the MEMS microphone is as follows: sound enters into the interior of the microphone via the sound access hole 10, then a diaphragm of the acoustic sensor 4 vibrates, so that capacitance between the diaphragm and a back plate changes. The integrated circuit processing chip 5 converts the change signal in capacitance into an electric signal. The electric signal is amplified and output to a noise reduction circuit. The noise reduction circuit can filter the audio electric signal. Finally, an electric signal, matching the microphone, is output.

By adopting the above-mentioned technical solutions, the present invention has the beneficial effects that the chip and electronics of the MEMS microphone are installed on two different circuit boards, respectively, so that an interior space of the microphone is fully utilized; an accommodating space is formed between the two circuit boards, facilitating the heat dissipation of the chip and the electronics (e.g., sensors), thus, a better sound transmission effect is achieved, and the microphone can be widely used.

As a preferred embodiment of the present invention, the integrated circuit processing chip 5 is electrically connected to the acoustic sensor 4 via gold wires 40, and the integrated circuit processing chip 5 is electrically connected to the second circuit board 3 via lead wires 8.

As a preferred embodiment of the present invention, a sound access hole is disposed on the first circuit board, an acoustic through-hole 30 is disposed on the second circuit board 3, and the position of the acoustic sensor 4 corresponds to that of the acoustic through-hole 30, so that sound can sequentially pass through the sound access hole 10, the acoustic cavity 70, the acoustic through-hole 30, and the acoustic sensor 3, thereby a smooth sound transmission is achieved.

As a preferred embodiment of the present invention, an accommodating space 60 is formed at a center of the supporting plate layer 6. The accommodating space 60 surrounds the sound access hole 10 and the acoustic through-hole 30. The pressure sensor 2 does not block a sound transmission channel for the sound access hole 10 and the acoustic through-hole 30, so that a path for sound transmission is not affected.

As a preferred embodiment of the present invention, the pressure sensor 2 is arranged inside the accommodating space 60, and a height of the pressure sensor 2 is less than a height of the supporting plate layer 6.

The supporting plate layer 6 is an integrally formed plate, so it is convenient to produce. The accommodating space is formed inside the integrally formed plate. An area of the accommodating space is greater than that of the pressure area 2.

The supporting plate layer 6 further comprises a first supporting plate, a second supporting plate, a third supporting plate, and a fourth supporting plate, all of which are sequentially connected to each other. The four supporting plates together form a rectangular frame, and space is saved, so that more electronics can be installed inside the accommodating space.

Preferably, the accommodating space 60 is provided so that the pressure sensor 2 and other electronic components of the microphone can be installed therein, whereby the space inside the microphone is fully improved. In addition, a top side of the pressure sensor 2 is not in contact with the second circuit board 3, so that the situation that the second circuit board 3 presses against the pressure sensor 2 can be avoided, and the security of the pressure sensor 2 is improved. Furthermore, since the top side and side surfaces of the pressure sensor are not in contact with any of the electronic components, enough space is available for heat dissipation, and it may facilitate the heat dissipation of the pressure senor 2 and other electronic components inside the microphone.

As a preferred embodiment of the present invention, a bottom of the first circuit board 1 is provided with a plurality of pads 11, enabling the microphone to be secured to external devices by soldering, and enabling the microphone to be electrically connected to external circuits.

Example 2

Figure 4:
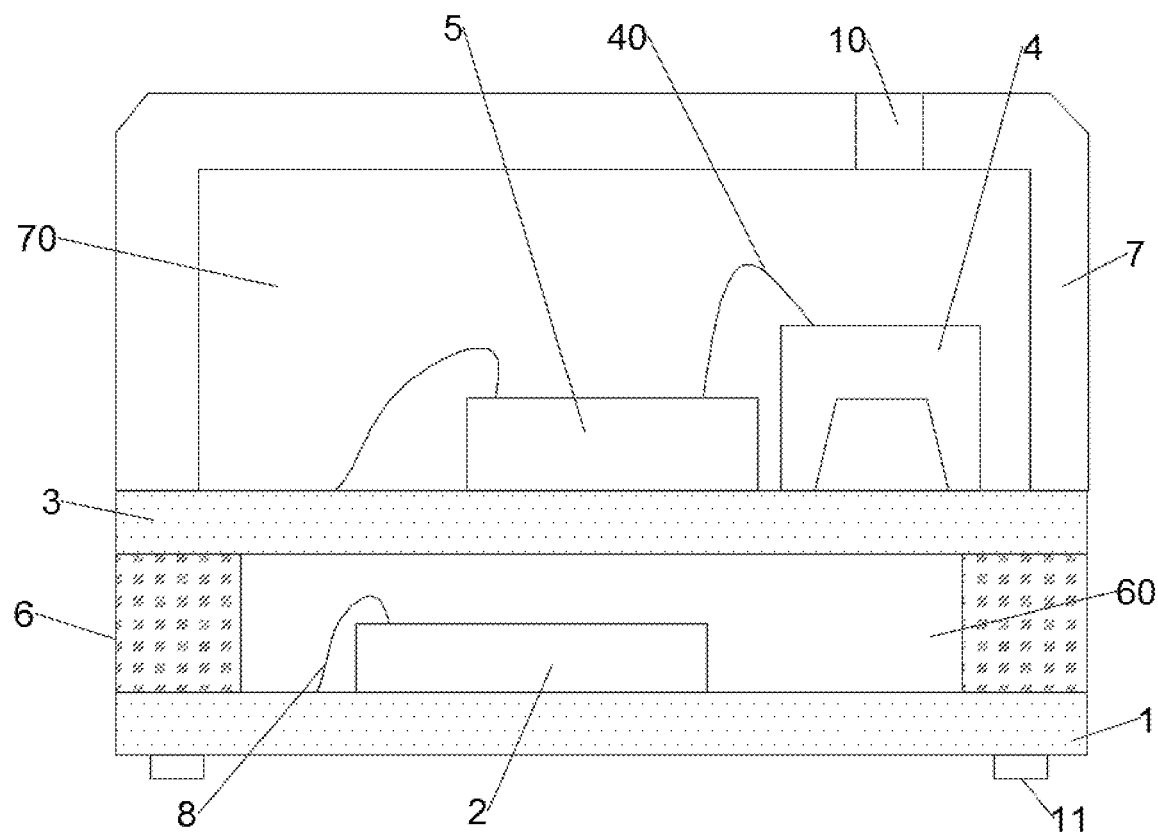
FIG. 4 is a schematic view of a microphone with a packaging structure according to a second embodiment of the present invention.

As shown in FIG. 4, a sound access hole 10 is formed on the packaging cover 7. The sound access hole 10 may not be formed on the first circuit board 1. An acoustic through-hole 30 may not be formed on the second circuit board 3. As a result, the difficulty for processing the microphone is reduced.

Example 3

Figure 5:
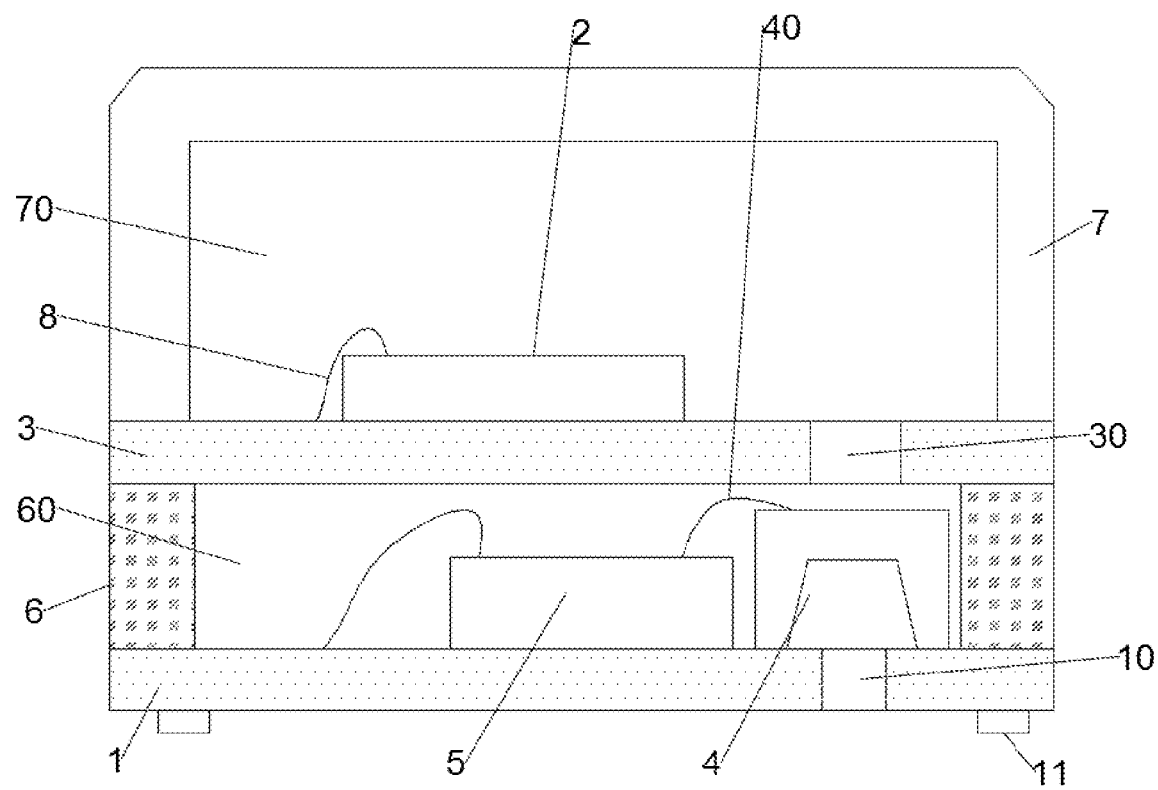
FIG. 5 is a schematic view of a microphone with a packaging structure according to a third embodiment of the present invention.
Figure 6:
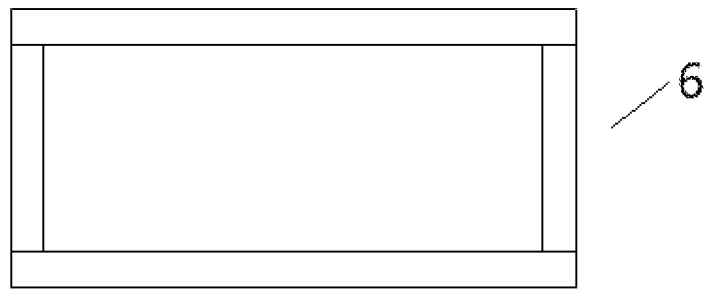
FIG. 6 is a top view of a supporting plate layer.

As shown in FIG. 5, both the acoustic sensor 4 and the integrated circuit processing chip 5 are disposed on the first circuit board 1 and are located inside the accommodating space 60. The pressure sensor 2 is installed on the second circuit board 3. The sound access hole 10 on the first circuit board 1 functions as the acoustic through-hole, and the position of the acoustic sensor corresponds to that of the sound access hole 10.

Such a packaging method has an advantage that a path through which sound travels into the microphone is shorter, so that the sound transmission efficiency is higher.

Additionally, the acoustic through-hole on the second circuit board 3 may retain, so that the acoustic sensor has a larger rear chamber (wherein, an area defined between the sound access hole and the diaphragm is referred to as a front chamber, and an area defined between the diaphragm and the acoustic cavity is referred to as the rear chamber). Arranging the sound access hole in a position closest to the acoustic sensor has the advantage that air volume in the rear chamber becomes larger, it in turn enables sound wave to push the movement of the diaphragm, thereby improving the sensibility, the signal-to-noise ratio, and the low frequency response of the microphone. Sound quality of the microphone is improved.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A MEMS (Micro-Electro-Mechanical system) microphone with a hybrid packaging structure, comprising:
   a first circuit board;
   a second circuit board, spaced apart from the first circuit board and parallel to the first circuit board;
   a packaging cover, covering the second circuit board, and forming an acoustic cavity with the second circuit board; wherein
   the first circuit board and the second circuit board form an accommodating space in which a pressure sensor is disposed;
   a supporting plate layer arranged along edges of the first circuit board and the second circuit board; wherein
   the supporting plate layer comprises a first supporting plate, a second supporting plate, a third supporting plate, and a fourth supporting plate, all of which are sequentially connected to each other to form a rectangular frame.

2. The MEMS microphone with a hybrid packaging structure of claim 1, further comprising at least one acoustic sensor and an integrated circuit processing chip each disposed on the first circuit board or the second circuit board.

3. The MEMS microphone with a hybrid packaging structure of claim 2, wherein both the integrated circuit processing chip and the acoustic sensor are disposed on the second circuit board, the integrated circuit processing chip is electrically connected to the second circuit board via lead wires, and the integrated circuit processing chip is electrically connected to the acoustic sensor via gold wires.

4. The MEMS microphone with a hybrid packaging structure of claim 2, wherein a sound access hole is disposed on the first circuit board, an acoustic through-hole is disposed on the second circuit board, and the acoustic sensor corresponds to the acoustic through-hole.

5. The MEMS microphone with a hybrid packaging structure of claim 1, wherein the supporting plate layer is an integrally formed plate, the accommodating space is provided inside the integrally formed plate, and an area of the accommodating space is larger than that of the pressure sensor.

6. The MEMS microphone with a hybrid packaging structure of claim 1, wherein a bottom of the first circuit board is provided with a plurality of pads.

\* \* \* \* \*